United States Patent
Oka et al.

(10) Patent No.: US 10,607,904 B2
(45) Date of Patent: Mar. 31, 2020

(54) METHOD FOR PRODUCING AIRTIGHT PACKAGE BY SEALING A GLASS LID TO A CONTAINER

(71) Applicant: NIPPON ELECTRIC GLASS CO., LTD., Otsu-shi, Shiga (JP)

(72) Inventors: Takuji Oka, Otsu (JP); Toru Shiragami, Otsu (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 0 days.

(21) Appl. No.: 16/078,641

(22) PCT Filed: Feb. 16, 2017

(86) PCT No.: PCT/JP2017/005702
§ 371 (c)(1),
(2) Date: Aug. 22, 2018

(87) PCT Pub. No.: WO2017/203761
PCT Pub. Date: Nov. 30, 2017

(65) Prior Publication Data
US 2019/0074234 A1    Mar. 7, 2019

(30) Foreign Application Priority Data
May 23, 2016    (JP) .................................. 2016-102407

(51) Int. Cl.
*H01L 23/10* (2006.01)
*B23K 26/324* (2014.01)
(Continued)

(52) U.S. Cl.
CPC ............ *H01L 23/10* (2013.01); *B23K 26/082* (2015.10); *B23K 26/0853* (2013.01);
(Continued)

(58) Field of Classification Search
CPC .......... H01L 23/02; H01L 23/04; H01L 23/10
See application file for complete search history.

(56) References Cited

U.S. PATENT DOCUMENTS

| 8,440,479 B2 * | 5/2013 | Nguyen | ............... H01L 51/448 313/512 |
| 2014/0023803 A1 | 1/2014 | Kawanami et al. | |

(Continued)

FOREIGN PATENT DOCUMENTS

| JP | 2007-288441 A | 11/2007 |
| JP | 2013-171907 A | 9/2013 |

(Continued)

OTHER PUBLICATIONS

Official Communication issued in International Patent Application No. PCT/JP2017/005702, dated Apr. 25, 2017.

*Primary Examiner* — Quoc D Hoang
(74) *Attorney, Agent, or Firm* — Keating and Bennett, LLP (57) ABSTRACT

Provided is a method for producing an airtight package that can reduce thermal stress occurring in the inside of a glass lid due to irradiation with laser light to prevent occurrence of cracks and the like in the glass lid. A method for producing an airtight package in which a container 1 containing a device 5 mounted therein is sealed with a glass lid 3 includes the steps of: mounting the device 5 to an interior of the container 1; disposing a sealing material 6 between a frame 2 of the container 1 and the glass lid 3 and placing the glass lid 3 on top of the frame 2 of the container 1; and irradiating the sealing material 6 through the glass lid 3 with laser light while scanning the laser light along the frame 2 to melt the sealing material 6 by heat and form a sealing material layer, thus sealing the glass lid 3 and the frame 2 together with the sealing material layer, wherein irradiation with the laser light is started from an irradiation start point (Continued)

B, then performed by scanning the laser light a plural number of times all around along the frame 2, and then terminated at an irradiation end point C located ahead of the irradiation start point B in a direction of the scanning A.

9 Claims, 6 Drawing Sheets

(51) Int. Cl.

| | | |
|---|---|---|
| *C03C 8/14* | (2006.01) | |
| *B23K 26/08* | (2014.01) | |
| *C03C 23/00* | (2006.01) | |
| *B23K 26/28* | (2014.01) | |
| *B23K 26/082* | (2014.01) | |
| *C03C 8/24* | (2006.01) | |
| *C03C 27/10* | (2006.01) | |
| *B23K 26/211* | (2014.01) | |
| *C03C 8/20* | (2006.01) | |
| *H01L 21/50* | (2006.01) | |
| *H01L 23/02* | (2006.01) | |
| *C03C 27/06* | (2006.01) | |
| *B23K 26/20* | (2014.01) | |
| *H01L 23/08* | (2006.01) | |
| *B23K 101/36* | (2006.01) | |
| *B23K 103/18* | (2006.01) | |
| *B23K 103/00* | (2006.01) | |

(52) U.S. Cl.
CPC .......... *B23K 26/206* (2013.01); *B23K 26/211* (2015.10); *B23K 26/28* (2013.01); *B23K 26/324* (2013.01); *C03C 8/14* (2013.01); *C03C 8/20* (2013.01); *C03C 8/24* (2013.01); *C03C 23/0025* (2013.01); *C03C 27/06* (2013.01); *C03C 27/10* (2013.01); *H01L 21/50* (2013.01); *H01L 23/02* (2013.01); *H01L 23/08* (2013.01); *B23K 2101/36* (2018.08); *B23K 2103/18* (2018.08); *B23K 2103/52* (2018.08); *B23K 2103/54* (2018.08)

(56) References Cited

U.S. PATENT DOCUMENTS

| | | | |
|---|---|---|---|
| 2014/0182917 A1* | 7/2014 | Mikado | H05K 3/0032 |
| | | | 174/262 |
| 2014/0268520 A1* | 9/2014 | Murakami | C03C 8/04 |
| | | | 361/679.01 |
| 2015/0179970 A1* | 6/2015 | Zhang | H01L 51/524 |
| | | | 257/40 |
| 2015/0266772 A1 | 9/2015 | Mitsui et al. | |

FOREIGN PATENT DOCUMENTS

| | | |
|---|---|---|
| JP | 2013-182977 A | 9/2013 |
| JP | 2014-236202 A | 12/2014 |
| JP | 2015-023263 A | 2/2015 |
| JP | 2015-220624 A | 12/2015 |
| WO | 2012/117978 A1 | 9/2012 |
| WO | 2014/092013 A1 | 6/2014 |

* cited by examiner

METHOD FOR PRODUCING AIRTIGHT PACKAGE BY SEALING A GLASS LID TO A CONTAINER

TECHNICAL FIELD

The present invention relates to methods for producing an airtight package for the purpose of mounting a device therein and sealing it and also to airtight packages.

BACKGROUND ART

An airtight package has heretofore been used for the purpose of mounting a device, such as an LED, therein and sealing it. Such an airtight package is formed so that a container capable of mounting a device therein and a cover member for sealing the interior of the container are bonded together.

Patent Literature 1 below discloses an airtight package formed so that a glass-ceramic substrate and a glass lid are bonded through a sealing material to each other. In Patent Literature 1, a glass frit made of a low-melting-point glass is used as the sealing material. Furthermore, in Patent Literature 1, the glass-ceramic substrate and the glass lid are bonded together by firing the glass frit to melt it.

However, if in mounting a device having low thermal resistance the glass frit is fired and melted in such a manner as in Patent Literature 1, characteristics of the device may be thermally degraded by the application of heat during firing. As a method for solving this, a method is conceivable for melting the glass frit by irradiating the glass frit with laser to locally heat it.

CITATION LIST

Patent Literature

[PTL 1]
JP-A-2014-236202

SUMMARY OF INVENTION

Technical Problem

By employing the above-described sealing with laser irradiation, thermal degradation of a mounted device can be prevented. In addition, since all materials forming the airtight package are made of inorganic materials, degradation due to penetration of oxygen, water, and so on can also be effectively prevented.

Meanwhile, in order to increase package strength while maintaining airtightness, there is demand to increase the thickness of the glass lid. However, the inventors have found that if the thickness of the glass lid is increased, there arises a problem that a temperature difference in the inside of the glass lid increases due to heating by laser irradiation and the attendant thermal stress may cause cracks in the glass lid.

An object of the present invention is to provide a method for producing an airtight package that can reduce thermal stress occurring in the inside of a glass lid due to irradiation with laser light to prevent occurrence of cracks and the like in the glass lid and to provide the airtight package.

Solution to Problem

A production method according to the present invention is a method for producing an airtight package in which a container containing a device mounted therein is sealed with a glass lid, the method including the steps of: mounting the device to an interior of the container; disposing a sealing material between a frame of the container and the glass lid and placing the glass lid on top of the frame of the container; and irradiating the sealing material through the glass lid with laser light while scanning the laser light along the frame to melt the sealing material by heat and form a sealing material layer, thus sealing the glass lid and the frame together with the sealing material layer, wherein irradiation with the laser light is started from an irradiation start point, then performed by scanning the laser light a plural number of times all around along the frame, and then terminated at an irradiation endpoint located ahead of the irradiation start point in a direction of the scanning.

In the present invention, a distance between the irradiation start point and the irradiation end point is preferably equal to or more than a radius of an irradiation spot of the laser light.

The scanning of the laser light is preferably performed at a rate of irradiation of 0.1 to 100 times per second to the same point on the frame.

A width of the sealing material in a direction substantially perpendicular to the direction of the scanning is preferably 90% or less of a width of an irradiation spot of the laser light.

The container is preferably made of a ceramic, a glass-ceramic or a glass.

The sealing material is preferably made of a glass frit.

The sealing material preferably contains a low-expansion, refractory filler made of at least one selected from the group consisting of cordierite, willemite, alumina, a zirconium phosphate-based compound, zircon, zirconia, tin oxide, quartz glass, β-quartz solid solution, β-eucryptite, and spodumene.

The sealing material preferably contains a laser absorbing material made of at least one selected from the group consisting of a Cu-based oxide, a Fe-based oxide, a Cr-based oxide, a Mn-based oxide, and a composite oxide thereof.

An airtight package according to the present invention includes: a device having an upper service temperature limit of 350° C. or less; a container containing the device mounted to an interior thereof; a glass lid having a thickness of more than 0.2 mm and sealing the container; and a sealing material layer disposed between a sealed portion of the container and the glass lid, wherein the sealing material layer is made of a glass containing a laser absorbing material.

The sealing material layer preferably contains a low-expansion, refractory filler made of at least one selected from the group consisting of cordierite, willemite, alumina, a zirconium phosphate-based compound, zircon, zirconia, tin oxide, quartz glass, β-quartz solid solution, β-eucryptite, and spodumene.

The device is, for example, a MEMS or a deep-ultraviolet LED.

Advantageous Effects of Invention

The production method according to the present invention enables reduction of thermal stress occurring in the inside of a glass lid due to irradiation with laser light to prevent occurrence of cracks and the like in the glass lid.

The airtight package according to the present invention has excellent airtightness and package strength.

DESCRIPTION OF EMBODIMENTS

Hereinafter, a description will be given of a preferred embodiment. However, the following embodiment is merely illustrative and the present invention is not limited to the following embodiment. Throughout the drawings, members having substantially the same functions may be referred to by the same reference characters.

Figure 1:
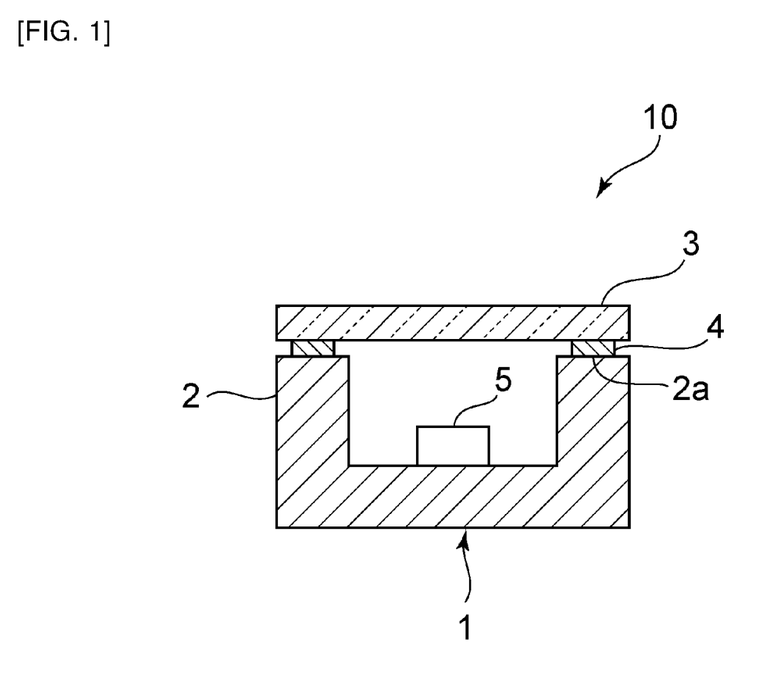
FIG. 1 is a schematic cross-sectional view showing an airtight package according to an embodiment of the present invention.

FIG. 1 is a schematic cross-sectional view showing an airtight package according to an embodiment of the present invention. As shown in FIG. 1, an airtight package 10 according to this embodiment includes: a container 1 containing a device 5 mounted to the interior thereof; a glass lid 3 sealing the container 1; and a sealing material layer 4 disposed between a frame 2 of the container 1 and the glass lid 3. The top surface 2a of the frame 2 and the glass lid 3 are bonded together by the sealing material layer 4, so that the container 1 is hermetically closed by the glass lid 3 to form an airtight structure.

Examples that can be used as a glass forming the glass lid 3 include $SiO_2$—$B_2O_3$—RO-based glasses (where R is Mg, Ca, Sr or Ba), $SiO_2$—$B_2O_3$—$R'_2O$-based glasses (where R' is Li, Na or Ka), $SiO_2$—$B_2O_3$—RO—$R'_2O$-based glasses, SnO—$P_2O_5$-based glasses, $TeO_2$-based glasses, and $Bi_2O_3$-based glasses.

Although no particular limitation is placed on the thickness of the glass lid 3 in the present invention, a glass lid 3 having a thickness ranging from 0.01 mm to 2.0 mm is generally used. If the thickness of the glass lid 3 is more than 0.2 mm, the glass lid 3 has large thermal stress during laser irradiation and is thus likely to crack. Therefore, if the thickness of the glass lid 3 is more than 0.2 mm, the effect of the present invention becomes more likely to be exerted. Furthermore, since the glass lid 3 has a thickness of more than 0.2 mm, the package strength can be increased. The thickness of the glass lid 3 is more preferably 0.3 mm or more and still more preferably 0.4 mm or more.

The container 1 is made of, for example, a ceramic, a glass-ceramic or a glass. Examples of the ceramic that can be cited include aluminum oxide, aluminum nitride, zirconia, and mullite. Examples of the glass-ceramic that can be cited are LTCCs (low temperature co-fired ceramics). A specific example of the LTCC that can be cited is a sintered body of a mixture of an inorganic powder, such as titanium oxide or niobium oxide, and a glass powder. For example, the same glass as used for the glass lid 3 can be used as the glass powder.

A glass frit containing a low-melting-point glass powder is preferably used as a sealing material 6 for forming the sealing material layer 4. If the glass frit contains a low-melting-point glass powder, the sealing material can be melted at a lower temperature, so that thermal degradation of the device can be further prevented. Examples of the low-melting-point glass powder that can be used include $Bi_2O_3$-based glass powders, SnO—$P_2O_5$-based glass powders, and $V_2O_5$—$TeO_2$-based glass powders. In order to improve the absorption of laser light, the glass may contain at least one pigment selected from the group consisting of CuO, $Cr_2O_3$, $Fe_2O_3$, $MnO_2$, and so on. The sealing material may contain, in addition to the above low-melting-point glass powder, a low-expansion, refractory filler, a laser light absorbing material, and/or so on. Examples of the low-expansion, refractory filler that can be cited include cordierite, willemite, alumina, zirconium phosphate-based compounds, zircon, zirconia, tin oxide, quartz glass, β-quartz solid solution, β-eucryptite, and spodumene. Examples of the laser light absorbing material that can be cited include at least one metal selected from the group consisting of Cu, Fe, Cr, Mn, and so on, and oxides and other compounds containing the at least one metal. The laser light absorbing material is particularly preferably made of at least one selected from the group consisting of a Cu-based oxide, a Fe-based oxide, a Cr-based oxide, a Mn-based oxide, and a composite oxide thereof.

No particular limitation is placed on the type of the device 5 in the present invention. However, since the production method according to the present invention can prevent thermal degradation during packaging of even a device having low thermal resistance, the effect of the present invention is more likely to be exerted with the use of a device having a low upper service temperature limit. Furthermore, the present invention enables high-airtightness packaging even if the thickness of the glass lid 3 is increased in order to increase the strength of the airtight package 10. Therefore, with the use of a device required to have high strength and airtightness, the effect of the present invention is more likely to be exerted. Hence, the effect of the present invention is more likely to be exerted when a device required to have a low upper service temperature limit and high airtightness is used as the device 5. Examples of such a device that can be cited include MEMSs (micro electro mechanical systems) and deep-ultraviolet LEDs (light emitting diodes).

As can be seen, the above MEMSs and deep-ultraviolet LEDs can be cited as examples of the device having an upper service temperature limit of 350° C. or less. Note that the upper service temperature limit of a device is a temperature defined as a standard on a device-by-device basis and is a temperature also referred to as an upper operating temperature limit or a maximum service temperature.

However, the device 5 is not limited to the above, but light-emitting devices, such as LEDs other than the above LEDs and LDs (laser diodes), light-receiving devices, such as CCDs (charge coupled devices), and other devices can also be used.

Figure 2:
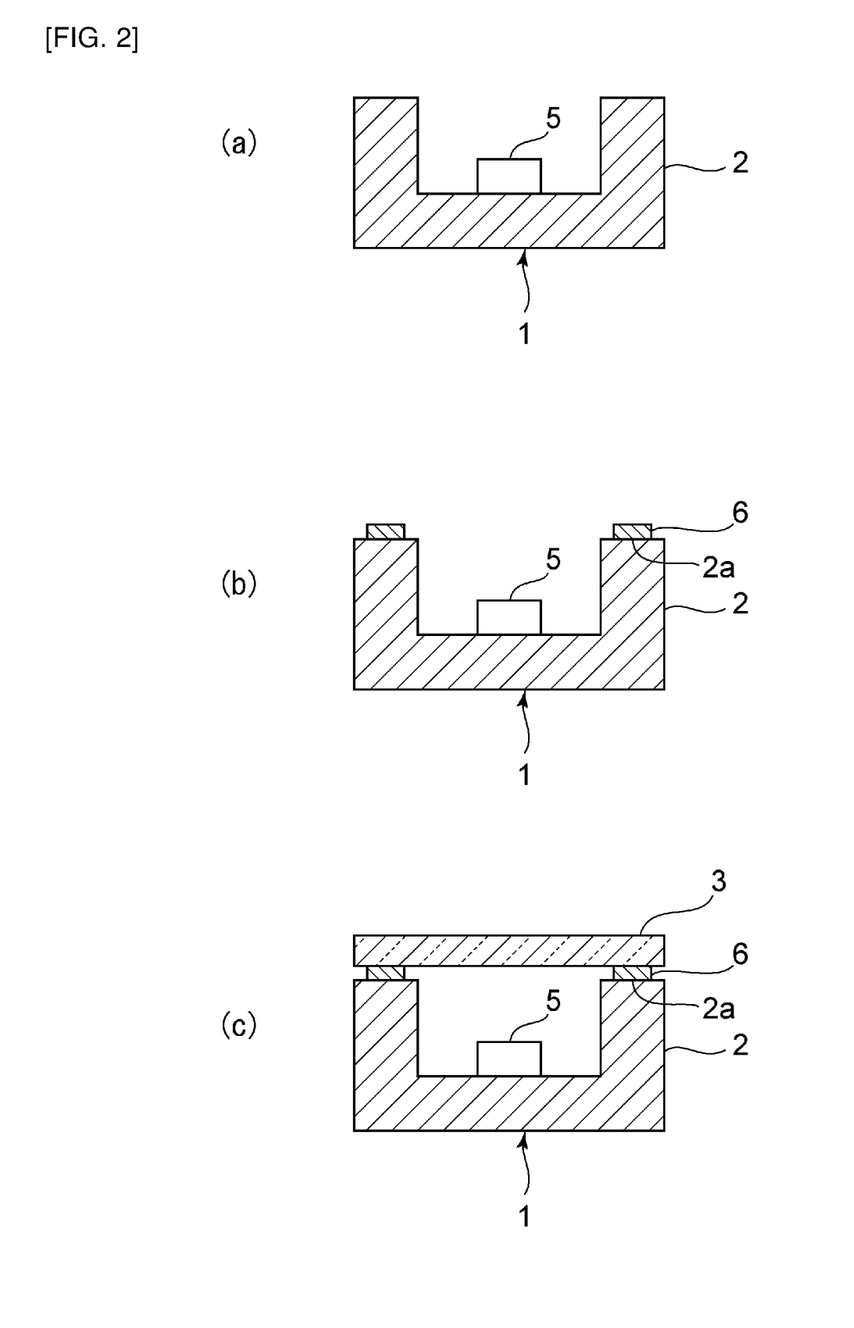
FIG. 2 is a schematic cross-sectional view for illustrating the process of producing the airtight package shown in FIG. 1.
Figure 3:
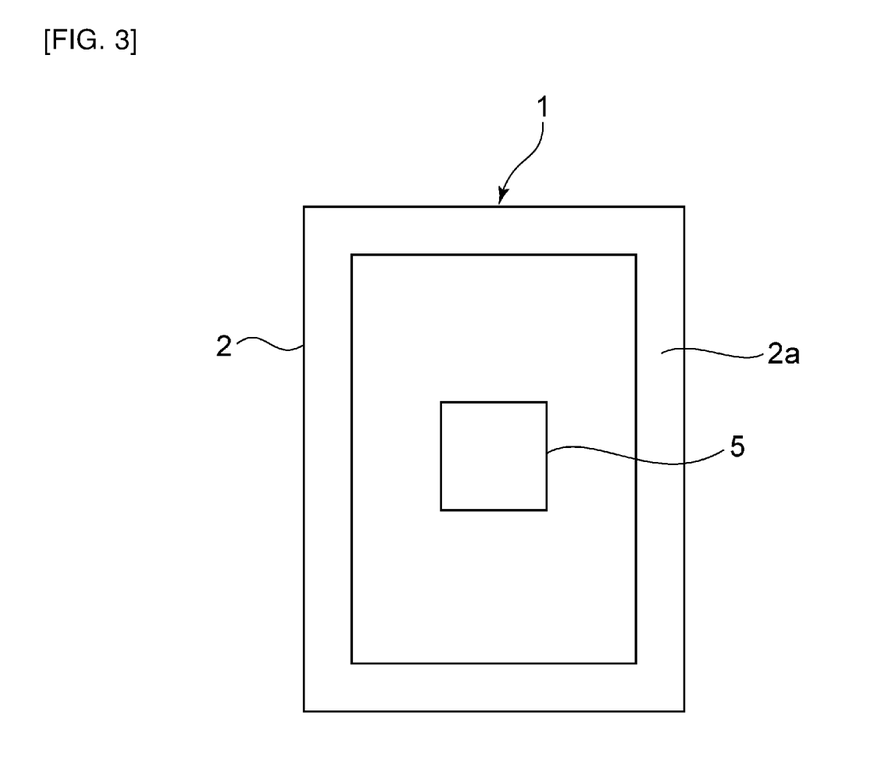
FIG. 3 is a schematic plan view for illustrating a production step for the airtight package shown in FIG. 2(a).

FIG. 2 is a schematic cross-sectional view for illustrating the process of producing the airtight package shown in FIG. 1. In the production method according to this embodiment, first, as shown in FIG. 2(a), a device 5 is mounted to the interior of an container 1. FIG. 3 is a schematic plan view for illustrating a production step for the airtight package shown in FIG. 2(a). As shown in FIG. 3, in this embodiment, a frame 2 has a rectangular shape.

Figure 4:
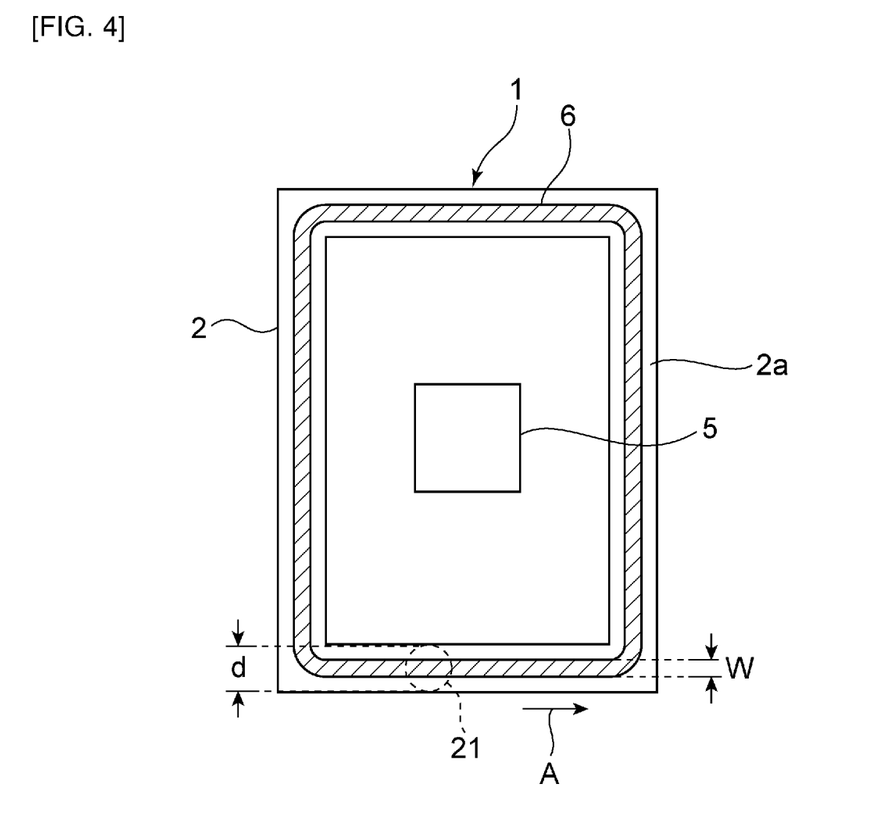
FIG. 4 is a schematic plan view for illustrating a production step for the airtight package shown in FIG. 2(b).

Next, as shown in FIG. 2(b), a sealing material 6 is applied on the top surface 2a of the frame 2. FIG. 4 is a schematic plan view for illustrating a production step for the airtight package shown in FIG. 2(b). As shown in FIG. 4, the sealing material 6 is applied along the shape of the frame 2 on the top surface 2a of the frame 2.

Next, as shown in FIG. 2(c), a glass lid 3 is placed on top of the frame 2 to which the sealing material 6 is applied. Thus, the sealing material 6 can be disposed between the top surface 2a of the frame 2 and the glass lid 3.

Figure 5:
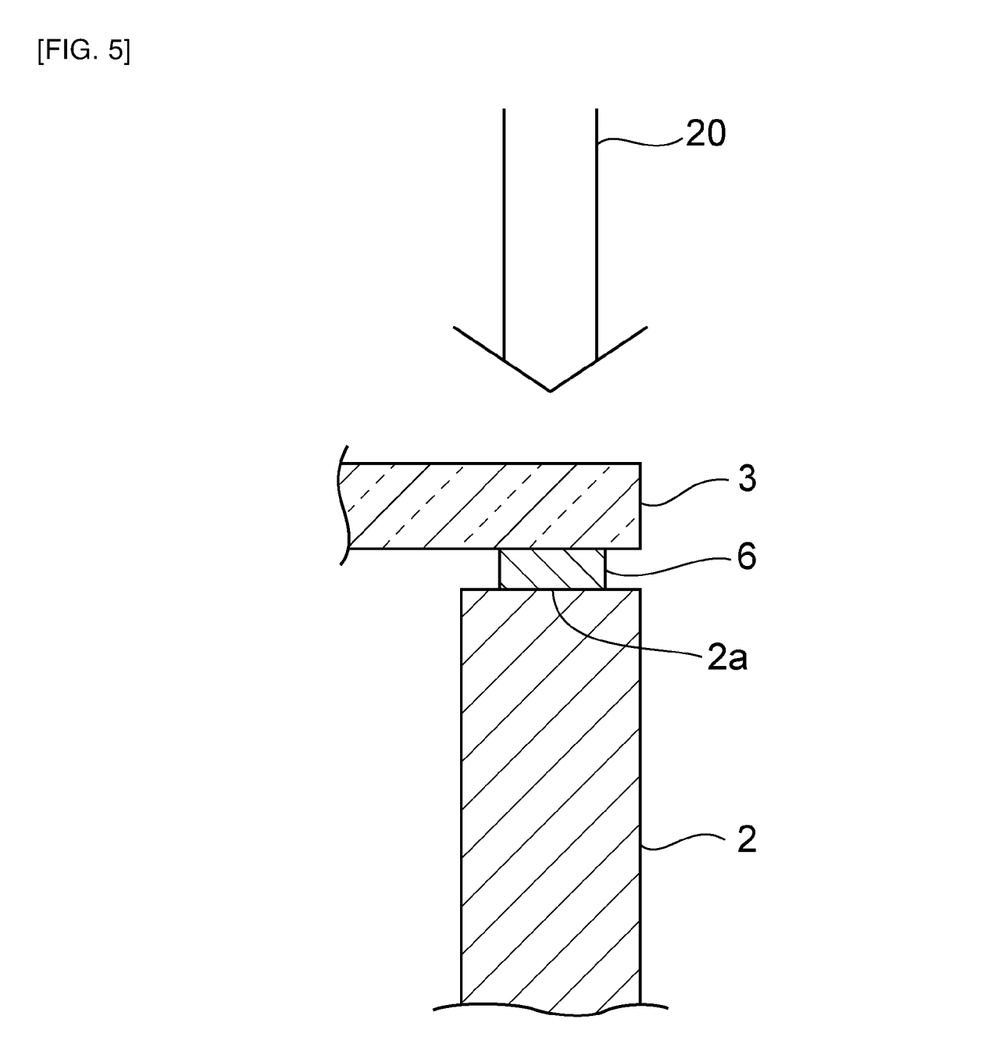
FIG. 5 is a schematic cross-sectional view showing a state where a sealing material is irradiated with laser light.

FIG. 5 is a schematic cross-sectional view showing a state where the sealing material is irradiated with laser light. As shown in FIG. 5, the sealing material 6 disposed between the top surface 2a of the frame 2 and the glass lid 3 is irradiated with laser light 20 and thus melted by heat. In doing so, as shown in FIG. 4, the sealing material 6 is melted by heat while an irradiation spot 21 of the laser light 20 is scanned along the frame 2 in a direction of scanning A. The width W of the sealing material 6 in a direction substantially perpendicular to the direction of scanning A is preferably 90% or less of the width d of the irradiation spot 21 of the laser light 20 and more preferably within a range of 10% to 80% thereof. Thus, the sealing material 6 can be melted by heat uniformly in the direction of width thereof.

Figure 6:
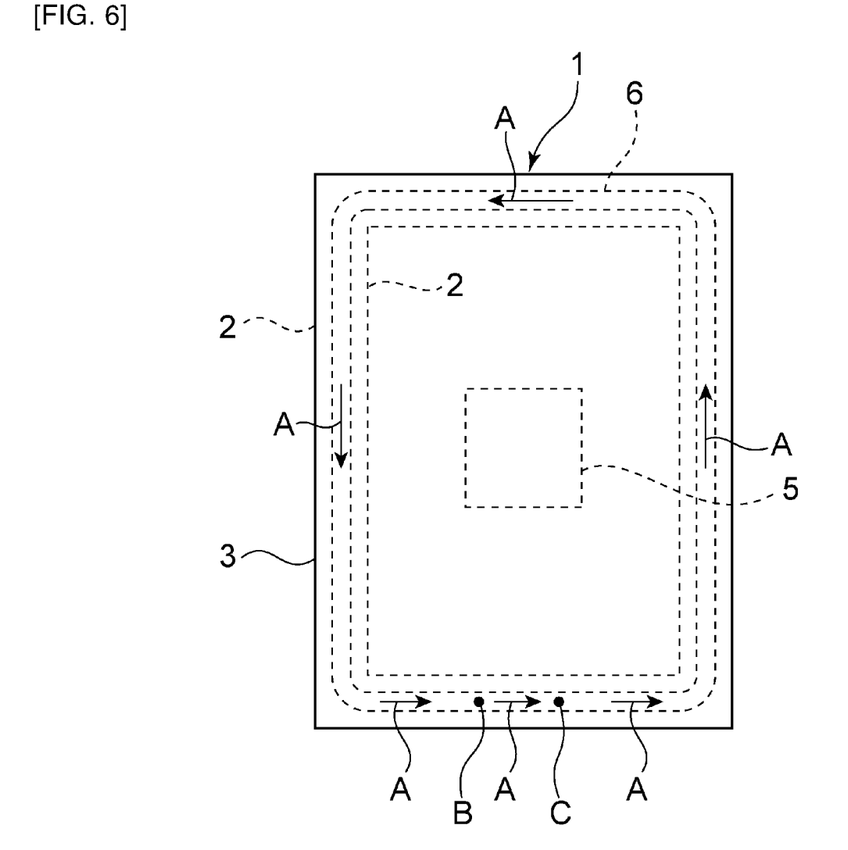
FIG. 6 is a schematic plan view for illustrating an irradiation start point and an irradiation end point of laser light in this embodiment.

FIG. 6 is a schematic plan view for illustrating an irradiation start point and an irradiation end point of laser light in this embodiment. In this embodiment, the irradiation with the laser light is started from an irradiation start point B, then performed by scanning the laser light a predetermined plural number of times all around along the frame 2 in the direction of scanning A, and then terminated at an irradiation end point C. The irradiation end point C is located ahead of the irradiation start point B in the direction of scanning A. Therefore, a region between the irradiation start point B and the irradiation end point C is irradiated with laser light one more than the predetermined number of times.

In this embodiment, laser light is scanned the predetermined plural number of times all around along the frame 2. Therefore, the sealing material 6 may be melted by heat by irradiating the same position on the frame 2 the predetermined plural number of times with laser light. Hence, the sealing material 6 can be irradiated with laser light of low power as compared to the case where the sealing material 6 is melted by heat in a single irradiation with laser light. Thus, the temperature difference occurring in the inside of the glass lid 3 due to irradiation with laser light can be reduced. Therefore, this embodiment enables reduction of the temperature difference in the inside of the glass lid 3, thus reducing thermal stress occurring in the inside of the glass lid 3 to prevent occurrence of cracks and the like in the glass lid 3. In order to further reduce the temperature difference in the inside of the glass lid 3 to further reduce the thermal stress occurring in the inside of the glass lid 3 and thus prevent occurrence of cracks and the like in the glass lid 3, the number of times of scanning around of the laser light is preferably three times or more and more preferably ten times or more. However, if the number of times of scanning around of laser light is too large, the irradiation time of laser light is long to decrease the production efficiency. Therefore, the number of times of scanning around of laser light is preferably not more than 100 times.

With increasing thickness of the glass lid 3, the temperature difference occurring in the inside of the glass lid 3 also increases. Therefore, generally, the glass lid 3 becomes more likely to cause cracks and the like with increasing thickness, but the present invention enables prevention of the occurrence of cracks and the like even if the thickness of the glass lid 3 is increased.

In this embodiment, the power of the laser light is preferably within a range of 3 W to 30 W and more preferably within a range of 3 W to 10 W. By employing these ranges, the occurrence of cracks and the like in the glass lid 3 can be more effectively prevented.

In this embodiment, the scanning of the laser light is preferably performed at a rate of irradiation of 0.1 to 100 times per second to the same point on the frame 2. By irradiating the sealing material with laser light a plural number of times along the frame 2 while scanning the laser light, the temperature can be gradually increased in an in-plane direction of the glass lid 3. Therefore, the temperature difference in the in-plane direction of the glass lid 3 can also be reduced. Hence, the occurrence of cracks and the like can be more effectively prevented. The scanning speed of the laser light is more preferably a speed at which the same point on the frame 2 is irradiated 10 to 50 times per second.

No particular limitation is placed on the wavelength of the laser light so long as it enables heating of the sealing material 6. From the viewpoint of reducing the temperature difference in the inside of the glass lid 3 due to irradiation with laser light, the wavelength of the laser light is preferably less absorbed by the glass lid 3. From this viewpoint, the wavelength of the laser light is preferably within a range of 600 to 1600 nm. For example, a semiconductor laser can be preferably used as a light source that emits such laser light.

Figure 7:
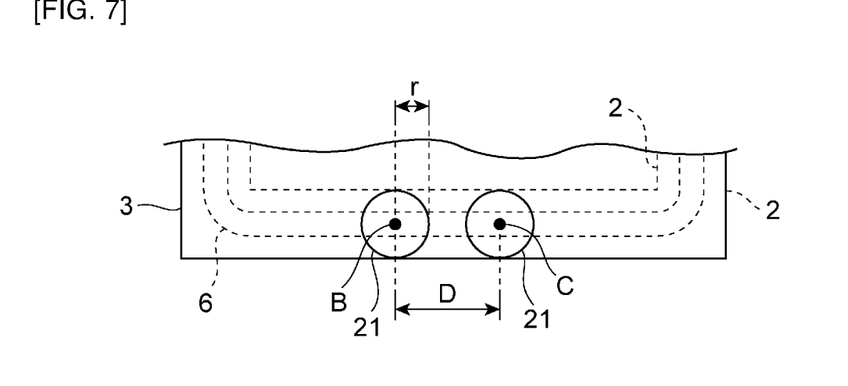
FIG. 7 is a schematic plan view showing on an enlarged scale the irradiation start point and the irradiation end point of laser light.

FIG. 7 is a schematic plan view showing on an enlarged scale the irradiation start point and the irradiation end point of laser light. As shown in FIG. 7, the distance D between the irradiation start point B of laser light and the irradiation end point C thereof is preferably equal to or more than the radius r of the irradiation spot 21 of the laser light. The vicinity of the irradiation start point B may be insufficiently irradiated with laser light and, thus, may not be sufficiently heated. In this embodiment, the irradiation end point C is set at a point beyond the irradiation start point B, so that the region between both the points is irradiated with laser light one more than the predetermined number of times to prevent occurrence of an insufficiently heated portion. By making the distance D between the irradiation start point B and the irradiation end point C equal to or more than the radius r of the irradiation spot 21 of the laser light, the occurrence of an insufficiently heated portion can be more securely prevented. The distance D between the irradiation start point B and the irradiation end point C is more preferably one to ten times the radius r of the irradiation spot 21.

In this embodiment, laser light is scanned the predetermined plural number of times all around along the frame 2. The same laser light from the same light source may be scanned all the way around or different laser lights from different light sources may be scanned all the way around. In the case where laser lights from a plurality of laser light sources are scanned all the way around, the ranges of irradiation with laser lights are preferably spaced at regular intervals in the overall length. In the case of using a plurality of light sources, the wavelengths and irradiation ranges of their laser lights may not necessarily be equal to each other but may be different from each other. For example, in relation to irradiation range, the laser lights may have different irradiation ranges offset from each other in a direction substantially perpendicular to the direction of scanning. Furthermore, the irradiation ranges may be configured so that one irradiation range is wider and another is narrower.

Although in the above embodiment the sealing material 6 is applied to the frame 2, the sealing material 6 may be applied to the glass lid 3. Alternatively, the sealing material 3 may be applied to both the frame 2 and the glass lid 3.

REFERENCE SIGNS LIST

1 . . . container
2 . . . frame
2a . . . top surface
3 . . . glass lid
4 . . . sealing material layer
5 . . . device
6 . . . sealing material
10 . . . airtight package
20 . . . laser light
21 . . . irradiation spot of laser light
A . . . direction of scanning
B . . . irradiation start point
C . . . irradiation end point
D . . . distance
W . . . width of sealing material
d . . . width of irradiation spot of laser light
r . . . radius of irradiation spot of laser light

The invention claimed is:

1. A method for producing an airtight package in which a container containing a device mounted therein is sealed with a glass lid, the method comprising the steps of:
   mounting the device to an interior of the container;
   disposing a sealing material between a frame of the container and the glass lid and placing the glass lid on top of the frame of the container; and
   irradiating the sealing material through the glass lid with laser light while scanning the laser light along the frame to melt the sealing material by heat and form a sealing material layer, thus sealing the glass lid and the frame together with the sealing material layer,
   wherein the step of irradiating the sealing material with the laser light is started from an irradiation start point, then performed by scanning the laser light a plural number of times all around along the frame, and then terminated at an irradiation end point located ahead of the irradiation start point in a direction of the scanning.

2. The method for producing an airtight package according to claim 1, wherein a distance between the irradiation start point and the irradiation end point is equal to or more than a radius of an irradiation spot of the laser light.

3. The method for producing an airtight package according to claim 1, wherein the scanning of the laser light is performed at a rate of irradiation of 0.1 to 100 times per second to the same point on the frame.

4. The method for producing an airtight package according to claim 1, wherein a width of the sealing material in a direction substantially perpendicular to the direction of the scanning is 90% or less of a width of an irradiation spot of the laser light.

5. The method for producing an airtight package according to claim 1, wherein the container is made of a ceramic, a glass-ceramic or a glass.

6. The method for producing an airtight package according to claim 1, wherein the sealing material is made of a glass frit.

7. The method for producing an airtight package according to claim 1, wherein the sealing material contains a low-expansion, refractory filler made of at least one selected from the group consisting of cordierite, willemite, alumina, a zirconium phosphate-based compound, zircon, zirconia, tin oxide, quartz glass, β-quartz solid solution, β-eucryptite, and spodumene.

8. The method for producing an airtight package according to claim 1, wherein the sealing material contains a laser absorbing material made of at least one selected from the group consisting of a Cu-based oxide, a Fe-based oxide, a Cr-based oxide, a Mn-based oxide, and a composite oxide thereof.

9. The method for producing an airtight package according to claim 1, wherein the plural number of times of scanning the laser light all around the frame is ten times or more.

* * * * *